United States Patent [19]

Leung et al.

[11] Patent Number: 5,777,909
[45] Date of Patent: Jul. 7, 1998

[54] HIGH PASS FILTER WITH COEFFICIENT SWITCHING TO IMPROVE SETTLING TIME

[75] Inventors: Ka Leung; Sarah Shuangxia Zhu, both of Austin, Tex.

[73] Assignee: Crystal Semiconductor Corporation, Austin, Tex.

[21] Appl. No.: 580,581

[22] Filed: Dec. 29, 1995

[51] Int. Cl.$^6$ ...................................................... G06F 17/10
[52] U.S. Cl. .............................. 364/724.011; 364/724.13
[58] Field of Search ........................ 364/724.011, 724.08, 364/724.1, 724.13, 724.17

[56] References Cited

U.S. PATENT DOCUMENTS

| | | | |
|---|---|---|---|
| 4,564,918 | 1/1986 | McNally et al. | 364/569 |
| 4,716,472 | 12/1987 | McNally | 360/8 |
| 4,748,578 | 5/1988 | Lagadec et al. | 364/724 |
| 4,772,871 | 9/1988 | Suzuki et al. | 341/155 |
| 4,780,892 | 10/1988 | Lagadec | 375/118 |
| 4,825,398 | 4/1989 | Koch et al. | 364/724.1 |
| 4,943,807 | 7/1990 | Early | 341/120 |
| 5,257,026 | 10/1993 | Thompson et al. | 341/118 |
| 5,357,969 | 10/1994 | Herleikson | 128/696 |
| 5,534,967 | 7/1996 | Matsuzawa | 354/430 |

OTHER PUBLICATIONS

Robert Adams and Tom Kwan, "Theory and VLSI Architectures for Asynchronous Sample–Rate Converters," *J. Audio Eng. Soc.*, vol. 41, No. 7/8, Jul./Aug., 1993, pp. 539–555.

Robert Adams and Tom Kwan, "A Stereo Asynchronous Digital Sample-Rate Converter for Digital Audio," *IEEE Journal of Solid-State Circuits*, vol. 29, No. 4, Apr. 1994, pp. 481–488.

"Advance Information: DSP56ADC16 16–Bit Sigma–Delta Analog-to–Digital Converter," Motorola, Inc., 1989, pp. 3–28.

M. S. Ghausi and K. R. Laker, "Modern Filter Design," by Bell Telephone Laboratories, Inc., pp. 342–357, 1981.

R. W. Adams, P. F. Ferguson, Jr., A. Fanesan, S. Vincelette, A. Volpe, and R. Libert, "Theory and Practical Implementation of a Fifth–Order Sigma–Delta A/D Converter," *J. Audio Eng. Soc.*, vol. 39, Nos. 7–8, pp. 515–527, Jul./Aug. 1991.

S. A. Jantzi, W. M. Snelgrove, and P. F. Ferguson, Jr., "A Fourth–Order Bandpass Sigma–Delta Modulator," *IEEE Journal of Solid–State Circuits*, vol. 28, No. 3, pp. 282–291, Mar. 1993.

R. Gregorian and G. C. Temes, "Analog MOS Integrated Circuits for Signal Processing," *A Wiley-Interscience Publication*, John Wiley and Sons, pp. 265–401, 1986.

Charles D. Thompson, Salvador R. Bernadas, "A Digitally–Corrected 20b Delta–Sigma Modulator", 1994 IEEE International Solid–State Circuits Conference, pp. 194–195.

Y. Matsuya, K. Uchimura, A. Iwata, T. Kobayashi, "A 16-bit Oversampling A–to–D Conversion Technology Using Triple–Integration Noise Shaping", IEEE Journal of Solid–State Circuits, vol. SC–22, Dec. 1987, pp. 921–928, 1987.

Mehdi Hatamiam and Keshab K. Parhi, "An 85–MHz Fourth–Order Programmable IIH Digital Filter Chip", IEEE Journal of Solid–State Circuits, vol. 27, No. 2, Feb. 1992, pp. 175–183.

(List continued on next page.)

*Primary Examiner*—Chuong Dinh Ngo
*Attorney, Agent, or Firm*—Gregory M. Howison; J. P. Violette

[57] ABSTRACT

A high pass filter is provided utilizing a digital filter with coefficients that can be switched to provide for two responses, a fast response and a slow response. A first response is provided by an accumulator block (38) disposed between the output and a summing junction (30) on the input of the digital filter. A multiplexer (40) selects between this accumulator block (38) and a slow response accumulator block (42). The switching is effected with a zero crossing detect circuit (26). When the first and faster response brings the DC level down to a value that is close to zero, the second and slower response is selected to basically lock it to zero.

26 Claims, 4 Drawing Sheets

OTHER PUBLICATIONS

David Vallancourt and Yannis P. Tsividis "A Fully Programmable Sampled–Data Analog CMOS Filter with Transfer–Function Coefficients Determined by Timing", IEEE Journal of Solid–State Circuits, vol. SC–22, No. 6, Dec. 1987, pp. 1022–1030.

Kin Lin and John Poulos, "Area Efficient Decimation Filter for an 18-bit Delta–Sigma Analog-to-Digital Convert", AES Feb. 1995, pp. 1–10.

Alan V. Oppenheim and Alan S. Wilpsky, "Signals and Systems", Analysis and Characterization of LTI Systems Using z–Transforms, Sec. 10.7, 1983.

David Vallancourt and Yannis P. Tsividis, "Timing–Controlled Fully Programmable Analog Signal Processors Using Switched Continuous–Time Filters", IEEE Transactions on Circuits and Systems, vol. 35, No. 8, Aug. 1988, pp. 947–954.

1994 Crystal Semiconductor Audio Databook, pp. 3–143.

DSP56000/DSP56001 Digital Processor User's Manual, Rev. 2, pp. 11–8–11–9, 1990.

Texas Instruments TMS320C3×User's Guide, 1992, pp. 8–12–8–16.

Andreas Antoniou, "Digital Filters", Second Edition, 1993, pp. 366–381.

STEP RESPONSE $n = \frac{1}{\omega_0} \arctan\left(\frac{1}{\alpha}\right)$ $$G1: H(Z) = \frac{1 + (-2 + 2^{-4} + 2^{-20})Z^{-1} + (1-Z^{-1})^2}{1 - Z^{-1}}$$

$$G2: H(Z) = \frac{(1-2^{-4})}{1-(1-2^{-12})Z^{-1}}$$

HIGH PASS FILTER WITH COEFFICIENT SWITCHING TO IMPROVE SETTLING TIME

TECHNICAL FIELD OF THE INVENTION

The present invention pertains in general to high pass filters and, more particularly, to a digital filter with an improved settling time provided by switching the digital filter between two responses.

BACKGROUND OF THE INVENTION

High pass filters are utilized to filter out unwanted low frequency noise. In audio applications, this is typically voice components at frequencies below 20 Hz. In order to provide a high level high pass filter, it is necessary to insure that the pass band is as flat as possible with as sharp a corner frequency as possible. In addition, to insure that the components of the frequency below 20 Hz are filtered out, it is necessary to insure that the DC component is also filtered out.

One problem that exists with very low cut-off frequency high pass filters is the long acquisition time of DC. In a step response, it is necessary to have a relatively fast response that quickly removes the DC voltage. Most simple first order filters with low cut-off frequency have relatively long time constants which will have a DC component that slowly decays to zero. However, for fast response filters that go to a zero DC voltage level very quickly, the cut-off frequency will lie in the audio band, resulting in gain error.

One technique for obtaining a fast response, filter without a large time constant is to utilize a two-step filter response that utilizes two filter first order responses. The first filter response is a fast response that very quickly settles the DC component toward a zero level in the presence of a step response and then switches over to a higher time constant or slow filter response to allow the filter to then settle towards the DC level at a slower rate. Typically, this utilizes a counter for allowing the first and faster filter response to be active for a predetermined period of time and then switch over to the slower response after the predetermined period of time. However, at the switching point, there is still a DC component present and the response of a second filter response determines how long that DC component will be present at a significant level. As such, even though this improves the situation, there is still a DC component present, which degrades the overall operation of the high pass filter.

SUMMARY OF THE INVENTION

The present invention disclosed and claimed herein comprises a high pass filter with a switched response. The high pass filter includes a first high pass filter section having a first response with a first time constant and a second high pass filter section having a second response and longer time constant. A detector is provided for detecting when the output of the high pass filter traverses from a first level to a second level below a predetermined threshold. A switching device is operable to switch the high pass filter from the first high pass filter section to the second high pass filter section when the detector detects the crossing of the predetermined threshold.

In another aspect of the present invention, the predetermined threshold voltage is zero voltage and the detector is operable to determine when the absolute value of the output crosses the DC zero value.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
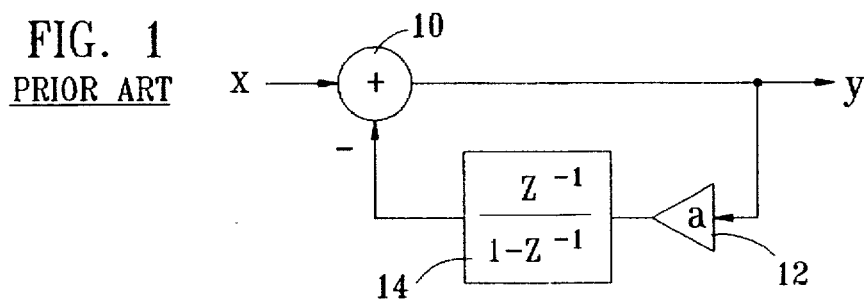
FIG. 1 illustrates a block diagram of a prior art filter.

Referring now to FIG. 1, there is illustrated a block diagram of a conventional prior art digital filter. An input x is input to a summing junction 10, the output thereof providing the output of the digital filter y. The output y is fed to the input of a coefficient block 12 which feeds a transfer function block 14. The transfer function block 14 comprises the accumulator, the output thereof being input to the negative input of the summing junction 10. The transfer function of the overall filter is the digital output divided by the input or:

$$H(z) = \frac{y(z)}{x(z)} = \frac{1 - z^{-1}}{1 - (1-a)z^{-1}} \quad (1)$$

The response of the above filter to a step response is the result of multiplying the transfer function by $1/(1-z^{-1})$ which provides the following inverse z-transform relationship:

$$z^{-1}\left[\frac{1}{1-(1-a)z^{-1}}\right] = (1-a)^n u(n) \quad (2)$$

Figure 2:
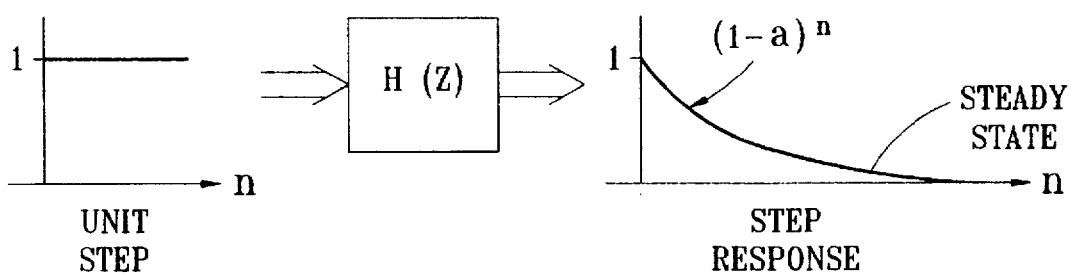
FIG. 2 illustrates a diagrammatic view of the step response for the prior art filter of FIG. 1.

This step response is illustrated in the prior art step response of FIG. 2. It can be seen that the step response in FIG. 2 results in a settling to a steady state value that has a predetermined response time period. Depending upon the value of "a", this will determine how fast the filter falls to a DC value of zero. This prior art filter is a first order filter which will always have a DC component. If a higher order filter is utilized, then the response will cross zero.

The response in the time domain in the right side of FIG. 2 follows a curve having a relationship $(1-a)^n$. With this type of filter, there is a zero on the unit circle and a single non-complex pole. If the value of coefficient "a" is set equal to 0.01, the value of $1-a$ is set equal to $0.99^n$, where n must be large when the steady state value falls to zero.

The frequency response of the filter for the above transform noted in Equation 1 is as follows:

$$|H(e^{j\omega T})| = \left|\frac{1 - e^{-j\omega T}}{1 - (1-a)e^{j\omega T}}\right| \quad (3)$$

The −3dB frequency for the filter is defined as follows:

$$|H(e^{-j\omega T})| = \frac{1}{\sqrt{2}} |H(e^{-j\pi})| \quad (4)$$

$$\left[\frac{2 - 2\cos\omega T}{1 - 2(1-a)\cos\omega T + (1-a)^2}\right]^{1/2} = \frac{1}{\sqrt{2}} \left[\frac{1 - e^{j\pi}}{1 - (1-a)e^{-j\pi}}\right] \quad (5)$$

$$\left[\frac{2 - 2\cos\omega T}{1 - 2(1-a)\cos\omega T + (1-a)^2}\right]^{1/2} = \frac{2}{(1 + (1-a))^2} \quad (6)$$

$$\cos\omega T = \frac{2(1-a)}{1 + (1-a)^2} \rightarrow \omega T \approx a \quad (7)$$

where $\omega T \approx a$.

As an application, consider that the corner frequency is much less than 20 Hz for an audio application. For a sampling frequency of 48 kHz with a coefficient of $2^{-12}$ this would result in $2\pi f_c/f_s = 2^{-12}$. This will result in a corner frequency of 1.9 Hz. The DC component is considered settled when it settles to within one half of an LSB of a converters dynamic range. For a 20-bit converter, this would define the value of n being equal to:

$$n = \frac{\log 2^{-21}}{\log(1 - 2^{-12})} \quad (8)$$

or a value of 59,614. This would require this number of steps or clock cycles for the DC component to settle within one half LSB of a 20-bit converter.

The prior art systems utilize what is sometimes referred to as a "gear shift" to reduce the number of cycles required to settle. This is achieved by varying the value of the coefficient "a" after counting by a predetermined number of counts. This is described in part in U.S. patent application Ser. No. 08/288,623, filed Aug. 10, 1994, entitled "A Digital Decimation Filter for Delta, Sigma, Analog-To-Digital Conversion with Multiple Decimation Stages" (Atty. Docket No. CRY-P1078A) which patent application is incorporated herein by reference.

Figure 3:
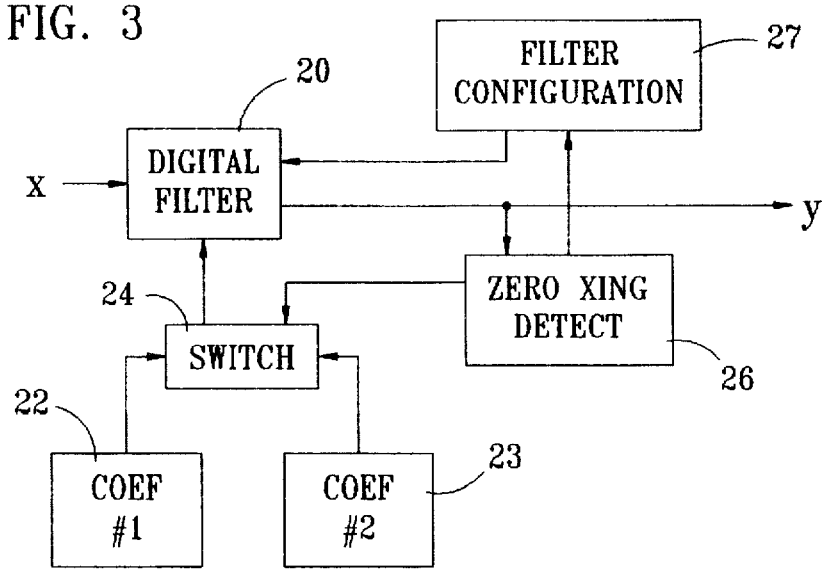
FIG. 3 illustrates a block diagram of the two step digital filter of the present invention.

Referring now to FIG. 3, there is illustrated a block diagram of the filter of the present invention. A digital filter 20 is provided which is of a Infinite Impulse Response (IIR) type. The digital filter 20 has associated therewith digital filter coefficients, there being two sets, one for the fast response to provide a first filter configuration and one for the slow response to provide a second filter configuration. The coefficients for the fast response are stored in a coefficient memory 22 and the coefficients for the slow response are stored in a coefficient memory 23. The filter 20 has two configurations, a first configuration associated with the first filter response and a second configuration for the second filter response. In the preferred embodiment, the first filter response is a second order response that has a zero crossing and the second response is a first order response with no zero crossing. The configuration is selected with a configuration block 27. However, the first and second filter responses could be first order responses, with only coefficient selection required.

The coefficient sets in the coefficient memories 22 and 23 are selected individually by a switch 24 for input to the digital filter 20 and the configuration selected with configuration block. The switching operation of the switch 24 is determined by a zero crossing detector 26 which determines when the output value of the DC component on the output has fallen below a certain level, typically less than one half the LSB of the overall digital filter 20. At this point, the switch 24 is activated to switch to the slower response filter in the coefficient memory 23. If first order responses are utilized, then a threshold is utilized to determine the switching point.

In operation, the filter is initially placed in the configuration for the first response during power up or reset. When it switches to the second response, this constitutes a normal operating mode and the system then remains there, even if the DC level rises above zero. With the preferred embodiment of the present invention, the second order sinusoidal response initially pulls the response down to a zero crossing, at which point the DC component is removed. By switching to a first order response at this point with no DC component, the DC value at the switch point is "stored".

Figure 4:
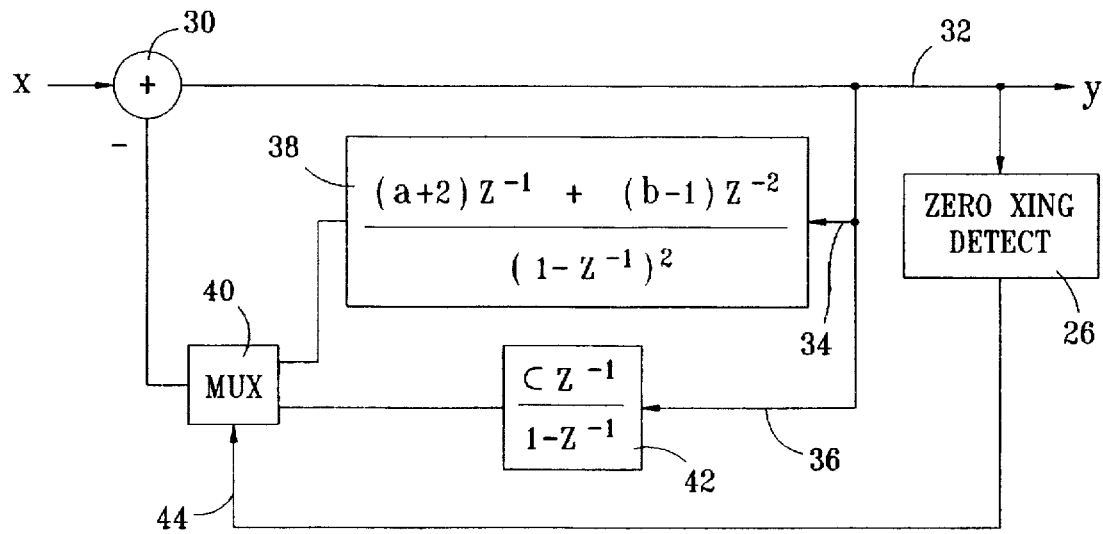
FIG. 4 illustrates a more detailed block diagram of the filter of FIG. 3.

Referring now to FIG. 4, there is illustrated a block diagram of the filter of the present invention. The input x is input to the positive input of a summing junction 30, the output thereof providing the output y on an output node 32. The output node 32 is fed back to the negative input of a summing junction 30 through one of two paths, a fast response path 34 or a slow response path 36. The fast response path is input to an accumulator function block 38 which is operable to provide a second order configuration having a zero crossing associated therewith, the output of the accumulator function block 38 input to one input of a multiplexer 40, the output of the multiplexer input to the negative input of the summation block 30. The slow response path is input to an accumulator function block 42, the output thereof input to the other input of the multiplexer 40, the multiplexer 40 controlled by a control signal on a line 44.

The function implemented in the accumulator block 38 provides a second order transfer function as follows:

$$\frac{(a+2)z^{-1} + (b-1)z^{-2}}{(1 - z^{-1})^2} \quad (9)$$

This transfer function of the filter whenever the high order accumulator block 38 is selected by the multiplexer 40 and the filter is operating with a fast response will be:

$$H(z) = \frac{(1 - z^{-1})^2}{1 - 2z^{-1} + z^{-2} + (a+2)z^{-1} + (b-1)z^{-2}} \quad (10)$$

$$H(z) = \frac{(1 - z^{-1})^2}{1 + az^{-1} + bz^{-2}} \quad (11)$$

As can be seen from Equation 12, there are two zeros on the unit circle and two poles. These two poles are selected in value such that they are complex. By choosing a complex pole pair, this provides an inverse z-transform of a combination of a sine/cosine. This sinusoidal response will have a detectable zero crossing, as will be described hereinbelow.

The step response for the fast response filter will, again, be the multiplication of the transfer function in Equation 12 by the term $1/(1-z^{-1})$. Recalling the z-transform pair as:

$$[r^n \cos\omega_0 n] u(n) \leftrightarrow \frac{1 - r\cos\omega_0 z^{-1}}{1 - 2r\cos\omega_0 z^{-1} + r^2 z^{-1}} \quad (12)$$

$$[r^n \cos\omega_0 n] u(n) \leftrightarrow \frac{r\sin\omega_0 z^{-1}}{1 - 2r\cos\omega_0 z^{-1} + r^2 z^{-1}} \quad (13)$$

There will be provided a second order polynomial function with the right side of Equations 5, 13 and 14 representing a complex pole pair in the denominator. The inverse z-transform of the step response will therefore be:

$$z^{-1}[H(z)] = z^{-1}\left[\frac{1 - z^{-1}}{1 + az^{-1} + bz^{-2}}\right] = \quad (14)$$

$$z^{-1}\left[\frac{1+\frac{a}{2}z^{-1}}{1+az^{-1}+bz^{-1}}\right]+z^{-1}\left[\frac{\left(-\frac{a}{2}-1\right)z^{-1}}{1+az^{-1}+bz^{-2}}\right]=$$

$$r^n[\cos\omega_n + \alpha\sin\omega_n]\mu(n)$$

$$r = b^{1/2}$$

$$\omega_0 = \cos^{-1}\left(\frac{a}{-2b^{1/2}}\right) \quad (15)$$

$$\alpha = \frac{\left(-\frac{a}{2}-1\right)}{r\sin\omega_0}$$

By comparing the inverse z-transform of Equation 16 with the z-transform of Equation 2, it can be seen that this provides an additional sinusoidal response, wherein the first zero crossing of the sinusoidal response of the z-transform will occur at:

$$n = \frac{1}{\omega_0}\arctan\left(\frac{1}{\alpha}\right) \quad (16)$$

Figure 5:
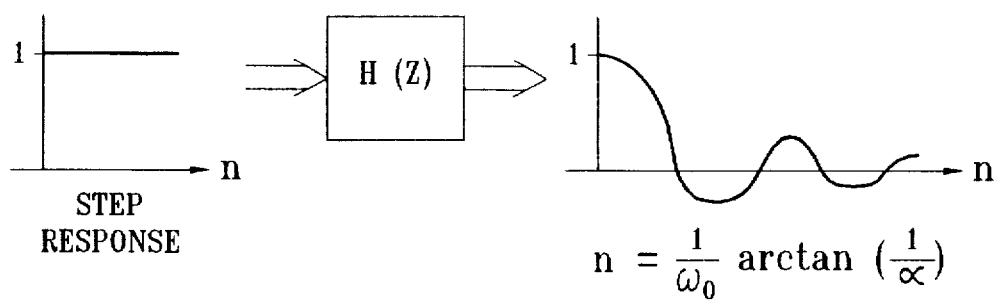
FIG. 5 illustrates the step response for the filter of FIG. 4.

The step response of the fast response filter is illustrated in FIG. 5.

In order to provide fast acquisition of the DC component, the zero crossing detector 26 provides a switching function which switches from the response illustrated in FIG. 5 to essentially the response illustrated in FIG. 2, a first order response. This provides a lower cut-off frequency to continuously block the DC offset at a relatively low rate. This is provided by the second path 36 through the accumulator function block 42.

During the operation of the system, the final value of the second order accumulator 38 (fast response) is utilized as the initial value of the first order accumulator 42. The final value of the second order accumulator 38 constitutes the DC component of the signal at input "x".

Figure 6:
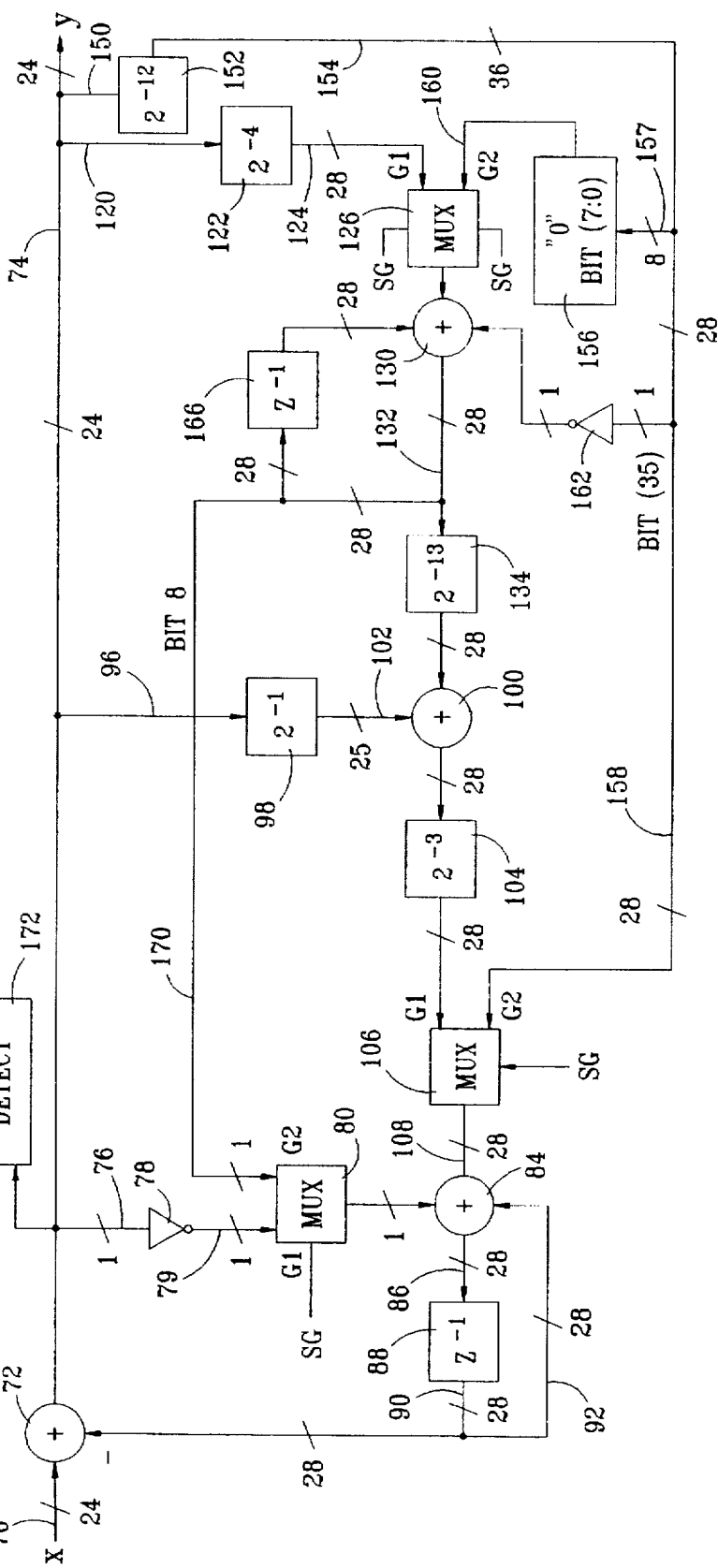
FIG. 6 illustrates a block diagram of the preferred embodiment of the filter of the present invention.

Referring now to FIG. 6, there is illustrated an overall block diagram of the preferred embodiment of the present invention. The x-input is received on a 24-bit input bus 70 and input to a summing junction 72. This is an output to a bus 74, which is a 24-bit bus. A 1-bit bus 76 branches off of the bus 74 and is input though an inverter 78 to provide an inverted bit on a bus 78, which is input to a multiplexer 80, multiplexer 80 having a second input, a G2 input, the other input being a G1 input to which the bus 78 is attached, these referred to as Gear 1 and Gear 2. The output of the multiplexer 80 is carried on a 1-bit bus 82 to a summing junction 84. The output of summing junction 84 is connected to a 28-bit bus 86, which is input to a register 88 to provide a delay function $z^{-1}$. The output of register 88 is output on a 28-bit bus 90 to the input of the summing junction 72, the negative input thereof Additionally, the bus 90 is connected to a feedback bus 92, which is input to the summing junction 84. Summing junction 84, register 88 and bus 92 form an accumulator.

A second branching bus 96 is connected between bus 74 and a coefficient block 98, coefficient block 98 having a coefficient of $2^{-1}$, the output thereof input to a summing junction 100 through a 25-bit bus 102. The output of summing junction 100 is connected through a 28-bit bus to a coefficient block 104 to provide a multiplication factor of $2^{-3}$. This is output on a 28-bit bus to a multiplexer 106 on the G1 input thereof The output of multiplexer 106 is connected through a 28-bit bus 108 to the input of the summing junction 84. As such, the output of multiplexer 106 can be added with the contents of bus 92 and also the bit that is contained on the bus 82.

A third path is provided from bus 74 on a bus 120 which is input to a coefficient block 122 to multiply the value by a factor of $2^{-4}$. This result is output on a bus 124, a 28-bit bus, to the G1 input of a multiplexer 126. The output of multiplexer 126 is input to a summing junction 130, the output thereof connected to a 28-bit bus 132 and then to the input of a coefficient block 134 to multiply the value by a factor of $2^{-13}$. This result is an output on a 28-bit bus to the input of the summing junction 100 for summing with the value on bus 102.

A fourth path is provided from bus 24 on a bus 150 to a coefficient block 152 to multiply the value on bus 150 by a factor of $2^{-12}$. This is output on a 36-bit bus 154, of which the 8 least significant bits of the bus 154 are input to a block 156. Block 156 basically utilizes the data on bus 157 as the 8 least significant bits and then fills the upper 20 bits of a 28-bit bus 160 with "0's". This is input to the G2 input of the multiplexer 56. The 35th bit of the bus 154 is extracted from the 28-bit bus 158 and inverted by an inverter 162 and then input to the summing junction 130 for adding with the output of the multiplexer 126.

Additionally, the bus 132, a 28-bit bus, has the 28 bits thereof input to a register block 166, the output thereof connected back to the input of the summing junction 130. Bit 8 of the 28-bit bus 132 is input as a 1-bit value to the G2 input of multiplexer 80 on a 1-bit bus 170.

Each of the multiplexers 80, 106, and 126 are controlled with an SG signal that is output by a threshold detect circuit 172, the threshold input thereof connected to a "0" value for DC control and the input thereof connected to the bus 24. The threshold detect circuit 172 is operable to detect whenever the value on bus 24 is within one half of the LSB of the converter value on either side thereof.

Figure 7:
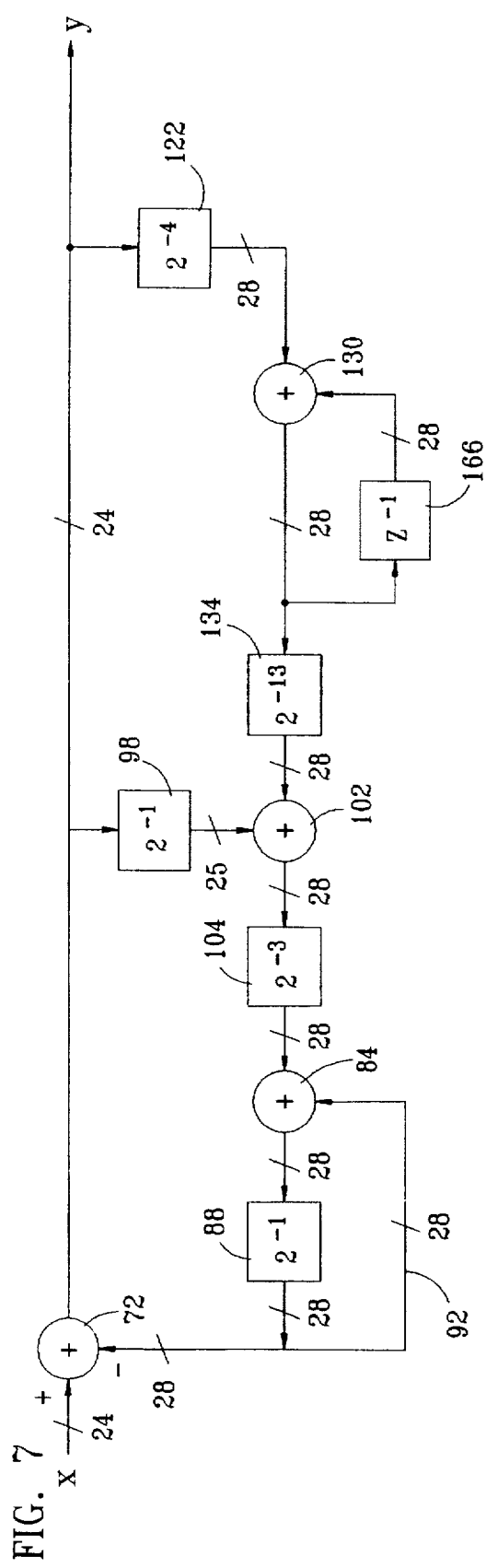
FIG. 7 illustrates a block diagram of the second order response portion of the embodiment of FIG. 5.
Figure 8:
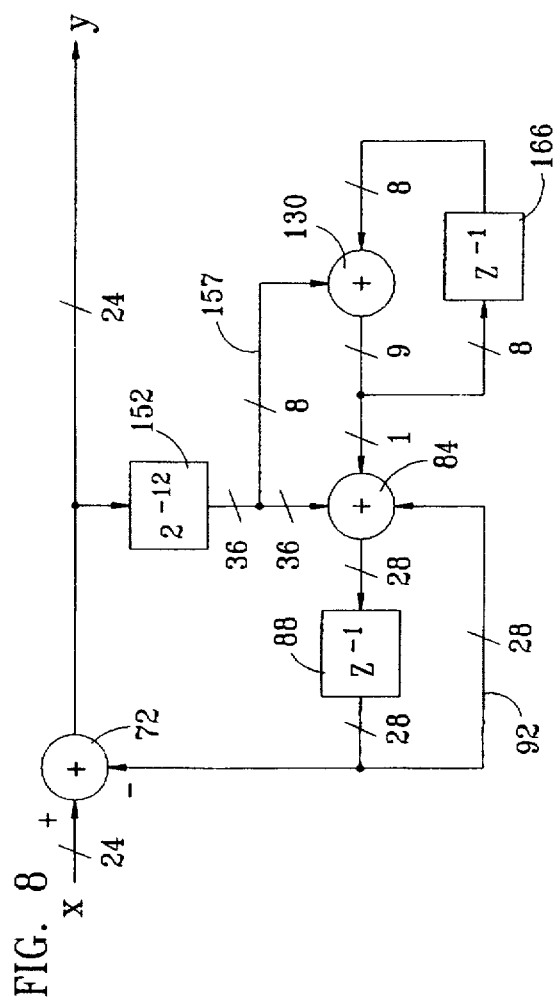
FIG. 8 illustrates a block diagram of the portion of the filter of the embodiment of FIG. 5 associated with the first order response or high time constant portion of the filter.

Referring now to FIG. 7, there is illustrated only a portion of the embodiment of FIG. 6 that is associated with the fast response or low time constant in the "first gear". The "second gear" or slow response section is illustrated in FIG. 8. It can be seen that the register blocks 88 and 166 are utilized in common for both structures. As such, this provides a more economical system.

In summary, there has been provided a high pass system that utilizes coefficient switching to provide two separate responses to eliminate the DC component. A zero crossing detector is provided for determining when the output comes within one half LSB of the converter and then switches between the two responses. Initially, the system works with a fast response to quickly settle to zero and, once a zero crossing is detected, it goes to a slow response to essentially lock it to DC zero.

Although the preferred embodiment has been described in detail, it should be understood that various changes, substitutions and alterations can be made therein without departing from the spirit and scope of the invention as defined by the appended claims.

What is claimed is:

1. A high pass filter with a switched response, comprising:
   a first high pass filter section having a first response with a first time constant;
   a second high pass filter section having a second response with a second time constant, said second time constant longer than said first time constant;
   a detector for detecting when the output DC signal level of said high pass filter falls from a point above a predetermined DC signal level threshold to a point below said predetermined DC signal level threshold; and a switching device for switching said high pass filter between the response associated with said first high pass filter section and the response associated with said second high pass filter section, such that said first high pass filter section is utilized for signal levels above said predetermined DC signal level threshold and said switching device switches to said second high pass filter section when said detector detects a crossing of said predetermined DC signal level threshold from a point above said predetermined DC signal level threshold to a point therebelow.

2. The high pass filter of claim 1, wherein said detector detects when said predetermined threshold is at a substantially zero DC voltage level.

3. The high pass filter of claim 2, wherein said detector detects the absolute value of the output DC signal level.

4. The high pass filter of claim 1, wherein said first high pass filter section is a multiple order high pass filter and said second high pass filter section is a first order high pass filter.

5. The high pass filter of claim 4, wherein said multiple order high pass filter has at least one zero DC crossing.

6. The high pass filter of claim 5, wherein said predetermined DC signal level threshold is at a substantially zero DC voltage.

7. A digital high pass filter, comprising:
a digital filter for realizing a filter function;
a coefficient memory for storing filter coefficients defining said filter function, said filter function having potentially first and second filter responses which are selectable;
a detector for detecting when the DC signal level on the output of said digital filter is above or below a predetermined DC signal level threshold voltage; and
a switch for controlling said digital filter to operate with said first filter response when the output signal level of said digital filter is on one side of said predetermined DC signal level threshold and with said second filter response when the output signal level of said digital filter is on the other side of said predetermined DC signal level threshold and wherein said first and second filter responses have different time constants.

8. The digital high pass filter of claim 7, wherein said predetermined DC signal level threshold is at a substantially zero DC voltage level.

9. The high pass filter of claim 8, wherein said detector detects whether the absolute value of the output signal level of said digital filter crosses a substantially DC zero voltage level.

10. The digital filter of claim 9, wherein said first filter response is faster than said second filter response with a lower time constant.

11. The digital filter of claim 7, wherein said digital filter has first and second configurations, with said first configuration associated with said first filter response and said second configuration associated with said second response and further comprising a configuration device for configuring said digital filter in either said first configuration or said second configuration, wherein said switch controls said configuration device such that said filter is operated in said first configuration when said switch controls said digital filter to operate with said first filter response and said configuration device configures said digital filter to operate in said second configuration when said switch controls said digital filter to operate with said second filter response.

12. The digital filter of claim 11, wherein configuration device with said first configuration to configure said digital filter as a multiple order high pass filter and with said second configuration to configure said digital filter as a first order high pass filter.

13. The digital filter of claim 12, wherein said multiple order high pass filter has at least one zero DC crossing.

14. The digital filter of claim 13, wherein said multiple order high pass filter is a sinusoid.

15. A method for providing a high pass filter with a switched response, comprising the steps of:
providing a first high pass filter section having a first response with a first time constant;
providing a second high pass filter section having a second response with a second time constant, the second time constant longer than the first time constant;
detecting when the output DC signal level of the high pass filter falls from a point above a pre-determined DC signal level threshold to a point below the pre-determined DC signal level threshold; and
switching the high pass filter between the response associated with the first high pass filter section and the response associated with the second high pass filter section, such that the first filter section is utilized for signal levels above the pre-determined DC signal level threshold and the step of switching switches to the second filter section when the step of detecting detects a signal level crossing of the pre-determined DC signal level threshold from a point above the pre-determined DC signal level threshold to a point below the pre-determined DC signal level threshold, such that the second filter section is utilized for signal levels below the pre-determined DC signal level.

16. The method of claim 15, wherein the step of detecting detects when the pre-determined DC signal level threshold is at a substantially zero DC voltage level.

17. The method of claim 16, wherein the step of detecting detects the absolute value of the output DC signal level.

18. The method of claim 15, wherein the step of providing the first high pass filter section comprises providing a multiple order high pass filter section, and the step of providing the second high pass filter section comprises providing a first order high pass filter section.

19. The method of claim 18, wherein the step of providing the multiple order high pass filter section comprises providing a multiple order high pass filter section having at least one zero DC signal level crossing.

20. The method of claim 19, wherein the pre-determined DC signal level threshold comprises a substantially zero DC voltage.

21. A method for providing a high pass filter, comprising the steps of:
providing a digital filter for realizing a filter function;
storing filter coefficients in a coefficient memory, the filter coefficients defining the filter function and the filter function having potentially first and second filter responses which are selectable;
detecting when the DC signal level on the output of the high pass filter is above or below a pre-determined DC signal level threshold; and
controlling the digital filter to operate with the first filter response when the output of the digital filter is on one side of the pre-determined DC signal level threshold and with the second filter response when the output of the digital filter is on the other side of the pre-determined DC signal level threshold and, wherein the first and second filter responses have different time constants.

22. The method of claim 21, wherein the pre-determined DC signal level threshold is at a substantially zero DC voltage.

23. The method of claim 22, wherein the step of detecting detects whether the absolute value of the output DC signal level of the digital filter crosses a substantially DC zero voltage level.

24. The method of claim 23, wherein the first filter response of the digital filter is faster than the second filter response of the digital filter and has a lower time constant.

25. The method of claim 21, wherein the step of providing the digital filter comprises providing a digital filter having a first configuration associated with the first filter response and the second configuration associated with the second filter response, and further comprising the step of configuring the digital filter in either the first configuration or the second configuration, with the step of controlling operable to configure the digital filter in the first configuration when operating with the first filter response and in the second configuration when operating with the second filter response wherein the first configuration is associated with a first pre-determined portion of the filter coefficients and the second configuration is associated with a second pre-determined portion of the filter coefficients.

26. The method of claim 25, wherein the step of configuring the digital filter in the first response comprises configuring the digital filter as a multiple order high pass filter, and the step of configuring the digital filter in the second configuration comprises configuring the digital filter as a first order high pass filter.

* * * * *